United States Patent
Osen et al.

(10) Patent No.: US 10,241,162 B2
(45) Date of Patent: Mar. 26, 2019

(54) NMR-MAS TURBINE ASSEMBLY

(71) Applicant: Bruker BioSpin GmbH, Rheinstetten (DE)

(72) Inventors: David Osen, Ettlingen (DE); Benno Knott, Karlsruhe (DE)

( * ) Notice: Subject to any disclaimer, the term of this patent is extended or adjusted under 35 U.S.C. 154(b) by 532 days.

(21) Appl. No.: 15/086,395

(22) Filed: Mar. 31, 2016

(65) Prior Publication Data
US 2017/0108561 A1    Apr. 20, 2017

(30) Foreign Application Priority Data
Oct. 14, 2015   (DE) .................. 20 2015 105 448 U

(51) Int. Cl.
| | | |
|---|---|---|
| G01R 33/30 | (2006.01) | |
| F01D 5/02 | (2006.01) | |
| F01D 5/14 | (2006.01) | |
| F01D 9/02 | (2006.01) | |
| F01D 25/16 | (2006.01) | |

(52) U.S. Cl.
CPC ............ *G01R 33/307* (2013.01); *F01D 5/02* (2013.01); *F01D 5/141* (2013.01); *F01D 9/02* (2013.01); *F01D 25/16* (2013.01); *F05D 2250/141* (2013.01); *F05D 2250/711* (2013.01)

(58) Field of Classification Search
CPC ..... E21B 4/02; E21B 3/00; E21B 7/00; E21B 21/08; E21B 3/02
USPC .................................................. 175/107, 57
See application file for complete search history.

(56) References Cited

U.S. PATENT DOCUMENTS

| | | | | |
|---|---|---|---|---|
| 4,511,841 A | * | 4/1985 | Bartuska ............... | G01R 33/307 324/318 |
| 5,202,633 A | * | 4/1993 | Doty .................... | G01R 33/307 324/321 |
| 5,508,615 A | * | 4/1996 | Doty .................... | G01R 33/307 324/318 |
| 6,803,764 B2 | | 10/2004 | Hioka | |
| 7,170,292 B2 | * | 1/2007 | Doty .................... | G01R 33/307 324/321 |
| 8,436,616 B2 | | 5/2013 | Endo et al. | |
| 2005/0139393 A1 | * | 6/2005 | Maurer ............... | E21B 41/0085 175/57 |
| 2014/0251033 A1 | * | 9/2014 | Unno ........................ | B01L 9/50 73/864.91 |
| 2015/0377019 A1 | * | 12/2015 | Gleitman ................ | E21B 43/26 166/250.01 |

\* cited by examiner

*Primary Examiner* — Christopher P McAndrew
(74) *Attorney, Agent, or Firm* — Benoit & Côté Inc.

(57) ABSTRACT

A nuclear magnetic resonance-magic angle spinning (NMR-MAS) turbine assembly has a MAS rotor with turbine cap having a stopper region and a turbine region. The stopper region allows feeding into a rotor tube and has at least one sealing section for resting against an inner wall of the rotor tube. The turbine region has a collar section for resting against a face side of the rotor tube and a turbine section that forms the turbine blades, which protrude axially from the collar section without extending radially further than the collar section. The arrangement of the rotor allows for very high rotation frequencies that, correspondingly, reduce line broadening in NMR measurements.

21 Claims, 5 Drawing Sheets

NMR-MAS TURBINE ASSEMBLY

BACKGROUND OF THE INVENTION

Field of the Invention

The invention relates generally to an NMR-MAS turbine assembly and, more specifically, to a turbine cap for an NMR-MAS rotor.

Description of the Related Art

An example of an NMR-MAS turbine cap is described in U.S. Pat. No. 8,436,616 B2. Nuclear magnetic resonance (NMR) spectroscopy is a powerful method of instrumental analysis based on the alignment of nuclear spins in a strong magnetic field and their behavior when radiated with high-frequency pulses. The respective chemical environment of the nuclei leads to characteristic changes in the resonant frequencies of the nuclei, thus enabling conclusions relating to their chemical composition to be drawn from NMR spectra of samples.

In solid samples, anisotropic interactions (in particular dipolar interactions and quadrupolar interactions as well as the anisotropic portion of the chemical shift) of the atomic nuclei lead to line broadening in the NMR spectra which reduces their significance and makes evaluation thereof more difficult. This line broadening can be significantly reduced by rapidly rotating the solid sample about an axis which is tilted at 54.74° to the direction of the magnetic field, which is referred to as "magic angle spinning" (MAS). The higher the rotation frequency, the better the anisotropy of the solid samples ascertained and the better the recorded NMR spectrum.

For an NMR-MAS experiment, the sample is usually placed in a cylindrical tube ("rotor tube"), which is closed or sealed with a base cap at its bottom end and is sealed with a turbine cap at its top end. Turbine blades are formed on the turbine cap. The sealed rotor tube, which as a whole is also referred to as an NMR-MAS rotor, is arranged in an NMR-MAS stator in which the rotor is usually mounted in a noncontact manner by means of two radial bearings and a bottom bearing with compressed gas flows. A drive nozzle system drives the turbine blades with compressed gas flows.

At higher speeds of rotation of the MAS rotor, it becomes increasingly difficult to ensure adequate running stability.

U.S. Pat. No. 6,803,764 (Jeol) describes an NMR-MAS rotor comprising a cylindrical tube, an end cap for a bottom bearing, and a turbine which is designed as a further cap with seven blades; the blade ends are rounded off. For the drive, compressed gas is blown onto the blades at >400 kPa in order to drive the rotor. The rotor has an outside diameter of 2-4 mm and can be rotated at a rotation frequency of up to 21.5 kHz. To improve the running stability, among other things, it is proposed that more blades than drive nozzles be provided, a complex ratio of the number of blades to the number of drive nozzles be provided, and finally the compressed gas be blown in at an angle between 30° and 60°.

Conventional NMR-MAS rotors are used for rotation frequencies of up to 70 kHz, wherein a limiting factor is the high tangential speed at the outer circumference of the rotor, which can approach the speed of sound. In order to be able to achieve higher rotation frequencies, the rotor must have a correspondingly smaller radius.

On the one hand, a small size of an MAS rotor, in particular a small outside diameter, is troublesome to produce. Furthermore, bending oscillations become relevant with small sizes.

U.S. Pat. No. 8,436,616 (Jeol) deals with the bending behavior of MAS rotors during the NMR measurement at high frequencies of up to 80 kHz. In particular, the length-diameter ratio is considered as a function of the modulus of elasticity of the rotor tube and recommendations are made for the ratio of length to outside diameter in order to avoid bending oscillations. MAS rotors with a diameter of 0.3-1.1 mm made of ZrO2 with end caps made of Vespel® are discussed. In an embodiment, a turbine cap with 5 blades is used. It is recommended that the ratio of inside diameter to outside diameter of the rotor tube be chosen to be 0.6 or less.

Known MAS rotors are not generally suitable for operation at higher rotation frequencies, for example of 100 kHz or more, in particular on account of too high tangential speeds. Scaling down conventional MAS rotors usually results in significant production difficulties or the MAS rotor does not run sufficiently stably. Finally, it is often simply impossible to find a suitable turbine cap, in particular a blade geometry, with which the required rotation frequency of the MAS rotor can be achieved.

SUMMARY OF THE INVENTION

The invention is directed to enabling NMR-MAS experiments at higher rotation frequencies, in particular at 100 kHz or more. In particular, a suitable turbine cap, a suitable MAS rotor and a suitable MAS stator for this purpose are presented.

This is achieved by a turbine cap for an NMR-MAS rotor, wherein the turbine cap has a stopper region for introducing into a rotor tube of the NMR-MAS rotor, and a turbine region which projects radially with respect to the stopper region and which is formed with five turbine blades, wherein the stopper region has at least one sealing section for resting against an inner wall of the rotor tube, wherein the sealing section has an outside diameter SDAD between 0.303 mm and 0.603 mm, preferably between 0.453 mm and 0.553 mm, wherein the turbine region has a collar section for resting against a face side of the rotor tube, wherein the collar section has an outside diameter TBAD with TBAD>SDAD, wherein the turbine region furthermore has a turbine section which forms the turbine blades, wherein the turbine blades protrude axially from the collar section, and wherein the turbine blades do not extend radially beyond the collar section, and wherein the turbine blades are in each case formed with a blade tip with a radius of curvature SSKR between 0.0020 mm and 0.0045 mm, preferably between 0.0025 mm and 0.0035 mm, and a concave first blade piece connecting to the blade tip having a first circular contour with a radius of curvature S1KR between 0.050 mm and 0.150 mm, preferably between 0.070 mm and 0.110 mm.

With such a turbine cap, it has been possible to drive an NMR-MAS rotor that has been sealed with the turbine cap according to the invention to a rotation frequency of up to 111 kHz. The turbine cap according to the invention is relatively easy to produce, in particular by fine milling. Good running stability of the MAS rotor has been established with the turbine cap according to the invention.

The turbine cap according to the invention has a blade geometry with which the blade tips taper relatively sharply; the radius of curvature SSKR at the blade tip is 0.0045 mm or less. Such a radius of curvature can still be produced relatively well (with little waste), in particular by fine milling. The blade tip then merges into a first concave blade piece with a comparatively large radius of curvature S1KR between 0.050 mm and 0.150 mm, usually about 0.090 mm. This internal depression can accommodate compressed gas that flows to it substantially in a tangential direction well and convert it to a rotary movement; at smaller radii, the efficiency of the rotor would reduce, and at larger radii the blade walls can easily break or turbulences can even be encouraged. With the blade geometry according to the invention, as has been shown in practice, a very good efficiency is possible when using contacting compressed gas flows.

The turbine blades rest on a generally disc-shaped collar section made of solid material by means of which the blades are mechanically stabilized. The collar section projects above a sealing section of the stopper region so that the collar section for its part can be supported on the face side of the rotor tube which is sealed by the turbine cap. The sealing section is adjusted for a comparatively small internal diameter of the rotor tube of 0.3 mm to 0.6 mm, thus enabling the rotor tube to have a correspondingly small outside diameter, in particular about 0.700 mm. With this outside diameter, a sufficient buffer with respect to the speed of sound is provided at the outside of the rotor tube at frequencies around 111 kHz.

In an exemplary embodiment of the invention, the following applies for the radius of curvature SSKR of the blade tip and the radius of curvature S1KR of the first blade piece: 20*SSKR≤S1KR≤50*SSKR, preferably 25*SSKR≤S1KR≤40*SSKR. These relationships result in a particularly good efficiency of the turbine.

Typically, it is provided that the turbine is produced from a polymer material, preferably a polyamide, particularly preferably the brand Vespel®. These materials are easy to work and are sufficiently mechanically stable even at high rotation speeds. Preferably, the outside diameter SDAD has a tolerance of ±0.005 mm or better, preferably ±0.003 mm or better. Preferably, the radius of curvature SSKR has a tolerance of ±0.0015 mm or better, preferably ±0.0010 mm or better (with regard to all turbine blades). Preferably, the radius of curvature S1KR has a tolerance of ±0.005 mm or better, preferably ±0.003 mm or better (with regard to all turbine blades). These tolerances have been proven in practice, in particular with regard to the running stability at high rotation frequencies. The stated tolerances can also still be provided with justifiable outlay for the production equipment and at justifiable expense.

All previous and following dimensional information which specifies a range between two limits (for example "from . . . to . . . " or "between . . . and . . . ") is in each case understood to include these limits.

In an exemplary embodiment of the turbine cap according to the invention, the collar section of the turbine region has an outside diameter TBAD between 0.650 mm and 0.695 mm, preferably between 0.675 mm and 0.685 mm. This size of collar section, which is also determining as a base surface for the turbine blades, enables a comparatively compact structure and at the same time good mechanical robustness to be achieved. Preferably, the outside diameter TBAD has a tolerance of ±0.005 mm or better, preferably ±0.003 mm or better.

An embodiment in which the first circular contour extends over a central angle between 135° and 160°, preferably between 140° and 155°, is also advantageous. Inflowing compressed gas, which follows the first circular contour, is therefore not fully deflected but is able to flow away with a lateral direction component. This counteracts turbulence of the inflowing and outflowing gas flows in the region of the first circular contour (which is particularly important for the introduction of force), which increases the efficiency of the turbine.

An embodiment in which a total contour length TSKL of a particular turbine blade in axial plan view is in each case between 0.40 mm and 0.75 mm, preferably between 0.48 mm and 0.60 mm, is also advantageous. On the one hand, this contour length, in particular of approx. 0.53 mm, is sufficient for a good transmission of force, and on the other for a good dissipation of the inflowing compressed gas, wherein a compact structure remains possible. Preferably, the contour length TSKL has a tolerance of ±0.03 mm or better, preferably ±0.02 mm or better (with regard to all turbine blades).

One particular embodiment provides that the turbine blades are in each case also designed with a straight blade piece, which is connected to the first blade piece, a convex, second blade piece, which is connected to the straight blade piece, having a second circular contour with a radius of curvature S2KR between 0.180 mm and 0.260 mm, preferably between 0.210 mm and 0.235 mm, and a convex, third blade piece, which is connected to the second blade piece and leads to the blade tip, having a third circular contour with a radius of curvature S3KR between 0.065 mm and 0.095 mm, preferably between 0.075 mm and 0.085 mm. The straight blade piece, the second blade piece and the third blade piece make the formation of a practically turbulence-free flow of compressed gas possible (usually compressed air or N2) with a good transmission of force to the turbine cap, above all at the first, convex blade piece. In this way, a very good efficiency of the turbine can be achieved. Preferably, the radii of curvature S2KR and S3KR in each case have a tolerance of ±0.005 mm or better, preferably ±0.003 mm or better (with regard to all turbine blades).

In a variation of this embodiment, the following applies for the radius of curvature S1KR of the first blade piece and the radius of curvature S3KR of the third blade piece: 0.6*S1KR≤S3KR≤1.0*S1KR, preferably 0.80*S1KR≤S3KR≤0.95*S1KR. These relationships have enabled turbulences in the region of the outer end of the turbine blade, which is to say in the vicinity of the blade tip, to be prevented to a great extent. In addition, a good mechanical stability or thickness of the wall of the turbine blade can be provided here.

In another development of the above embodiment, it is provided that in an axial plan view of a particular turbine blade a contour length GSKL of the straight blade piece is between 0.055 mm and 0.095 mm, preferably between 0.070 mm and 0.080 mm, a contour length S2KL of the second blade piece is between 0.110 mm and 0.160 mm, preferably between 0.125 mm and 0.145 mm, and a contour length S3KL of the third blade piece is between 0.060 mm and 0.110 mm, preferably between 0.075 mm and 0.090 mm. These contour lengths have shown good results in practice. The compressed air flowing to the first blade piece can be dissipated in a well-controlled manner, thus enabling turbulences to be efficiently avoided. Typically, the tolerance for the above-mentioned contour lengths is in each case ±0.01 mm or better, preferably ±0.005 mm or better.

In an advantageous embodiment, in the case of the turbine blades, a central axis of the first circular contour of the first, concave blade piece is in each case arranged at a distance S1AB from a rotor axis of the turbine cap between 0.24 mm and 0.32 mm, preferably between 0.26 mm and 0.29 mm. This positioning results in a flat, approximately tangential angle of incidence of the driving gas flow at the end of the turbine blade near to the blade tip in the first blade piece when the inflowing gas flow is approximately tangential. This enables a particularly high efficiency of the turbine. Preferably, S1AB has a tolerance of ±0.01 mm or better, preferably ±0.005 mm or better (with regard to all turbine blades).

Also presented is an embodiment in which, in the case of the turbine blades, a central axis of the first circular contour of the first, concave blade piece is in each case arranged at a distance S1AB from a rotor axis of the turbine cap, wherein the following applies: $0.70*TBAD/2 \leq S1AB \leq 0.95*TBAD/2$, preferably $0.78*TBAD/2 \leq S1AB \leq 0.85*TBAD/2$. This positioning also results in a flat, approximately tangential angle of incidence of the driving gas flow at the end of the turbine blade near to the blade tip in the first blade piece when the inflowing gas flow is approximately tangential. This in turn enables a particularly high efficiency of the turbine.

Also presented is an embodiment which provides that the collar section has an axial height BAH between 0.15 mm and 0.30 mm, preferably between 0.16 mm and 0.24 mm, and that the turbine section has an axial height TAH between 0.32 mm and 0.55 mm, preferably between 0.36 mm and 0.44 mm. With this design, the collar section imparts sufficient mechanical stability for the turbine blades, wherein, at the same time, a compact structure is maintained.

The specified height TAH, in particular of approx. 0.40 mm, can use inflowing compressed gases especially well, particularly in the case of drive nozzles with a diameter of 0.1 mm to 0.3 mm. Preferably, the axial height BAH and the axial height TAH in each case have a tolerance of ±0.02 mm or better, preferably ±0.005 mm or better.

Also within the framework of the present invention falls an NMR-MAS rotor comprising a turbine cap and a rotor tube, characterized in that, according to the invention, the turbine cap is designed as described above, the rotor tube has an outside diameter RRAD between 0.675 mm and 0.725 mm, preferably between 0.695 mm and 0.705 mm, particularly preferably between 0.698 mm and 0.702 mm, the rotor tube has an inside diameter RRID, wherein the outside diameter SDAD of the at least one sealing section of the stopper region of the turbine cap is greater than RRID by an excess UEM, wherein UEM is between 0.015 mm and 0.045 mm, preferably between 0.025 and 0.035 mm, and the rotor tube has a length between 4.15 mm and 5.15 mm, preferably between 4.30 mm and 5.00 mm.

The MAS rotor according to the invention enables a rotation frequency of 100 kHz and above; in the experiment, a rotation frequency of 111 kHz has been achieved with approximately 4 bar inflowing compressed gas. The NMR-MAS rotor according to the invention can be produced with justifiable production outlay and at justifiable cost and enables a significant improvement of the line sharpness in NMR spectra of solid samples compared with conventional rotors.

The length of the rotor tube minimizes bending oscillations, thus enabling the NMR-MAS rotor to be operated continuously without oscillations which overload the rotor occurring. The natural resonance of the rotor tube lies well above maximum rotation frequencies, such as 111 kHz for example, for which the MAS rotor is used. A typical natural resonant frequency of a rotor tube within the framework of the invention lies in the vicinity of 150 kHz or more.

The rotor tube is adjusted to the turbine cap according to the invention, particularly in its outside diameter. The excess size enables the turbine cap to be securely retained in a press fit with the stopper region in or on the rotor tube. The stopper region is typically made of solid material (without a central material recess along the axis) in order to enable a particularly secure fit.

Commensurate with the dimensions of the turbine cap according to the invention, the rotor tube (when assuming an excess size UEM of 0.003 mm and an outside diameter RRAD of 0.700 mm) has an inside diameter RRID between 0.30 mm and 0.60 mm, preferably between 0.45 mm 0.55 mm, and a wall thickness between 0.05 mm and 0.20 mm, preferably between 0.075 mm and 0.125 mm. The tolerance of the inside diameter RRID is typically ±0.005 mm or better, preferably 0.003 mm or better.

Typically, the outside diameter RRAD has a tolerance (concentricity tolerance) of ±0.005 mm or better, preferably ±0.004 mm or better, particularly preferably ±0.002 mm or better. Preferably, the length of the rotor tube has a tolerance of ±0.02 mm or better, preferably ±0.01 mm or better. The rotor tube is preferably made of zirconium dioxide; alternatively, other ceramic materials such as $Si_3N_4$ or $Al_2O_3$ can be used.

In an exemplary embodiment of the NMR-MAS rotor according to the invention, the following applies: $0.64 \leq RRID/RRAD \leq 0.80$, preferably $0.67 \leq RRID/RRAD \leq 0.75$. With these diameter relationships, a comparatively high proportion by volume is made available for the sample without too much detriment to the mechanical robustness of the rotor tube. The oscillation behavior with these diameter relationships is also favorable, thus enabling the NMR-MAS rotor to be operated with good smooth-running characteristics when the rotor is filled with a sample.

Also advantageous is an embodiment which provides that the rotor tube is open on both sides, that the NMR-MAS rotor furthermore has a bottom cap, wherein the bottom cap has an insertion region for feeding into the rotor tube and a bearing region for forming a Bernoulli bearing, that the insertion region has at least one sealing section for resting against the inner wall of the rotor tube, wherein the outside diameter EDAD of the sealing section of the insertion region of the bottom cap is greater than the inside diameter RRID of the rotor tube by the excess UEM. With an end that is open at the bottom, the production of the rotor tube is considerably simplified, and in particular the emptying and cleaning of the rotor tube for re-use on completion of a measurement is also simplified. The excess size enables the bottom cap to be securely retained in a press fit in or on the rotor tube. The insertion region is typically made of solid material (without a central material recess along the axis) in order to enable a particularly secure fit.

An advantageous development of this embodiment provides that the bearing region forms a flat face surface with an axial runout of 0.005 mm or better, in particular wherein the axial runout is between 0.005 mm and 0.001 mm. The flat face surface and the specified axial runout ensure a central introduction of force by a compressed gas flow of a bottom bearing.

In another embodiment, TBAD<RRAD, preferably TBAD+0.010 mm ≤ RRAD ≤ TBAD+0.040 mm. Because the outside diameter of the collar section of the turbine region, and therefore also of the turbine section, is less than the outside diameter of the rotor tube, the turbine region is prevented from impacting on the stator. Removal of the turbine cap after an NMR measurement can also be simplified.

Likewise, within the framework of the present invention falls an NMR-MAS stator for accommodating an NMR-MAS rotor according to the invention and described above, comprising a bottom bearing comprising at least one bearing nozzle, at least two radial bearings, each comprising a plurality of bearing nozzles, and at least one drive nozzle system comprising a plurality of drive nozzles, wherein a first ventilation slot is provided between the topmost radial bearing and the drive nozzle system in order to dissipate at least part of a compressed drive gas, and wherein a drive distance that is the axial distance between the bottom edge of the first ventilation slot and the central plane of the drive nozzles of the drive nozzle system is between 0.5 mm and 1.0 mm. An NMR-MAS stator of this type enables an NMR-MAS rotor according to the invention to be accelerated to particularly high rotation frequencies. The bearing nozzles and drive nozzles are operated with compressed gas, for example compressed air or N2, and support the rotor in a noncontact manner and drive it. The compressed drive gas in particular can be dissipated to the outside through the first ventilation slot, as a result of which turbulences can be avoided and the flow of driving gas can be increased in order to achieve a higher rotation speed. As a rule, the first ventilation slot comprises an annular space around the rotor, between top radial bearing and the drive nozzle system, usually at the level of the bottom part of the turbine region of the turbine cap, and openings and/or channels to the outside in the vicinity of the stator or probe. The small drive distance prevents the occurrence of oscillations in the rotor; preferably, the drive distance lies between 0.6 mm and 0.7 mm. By definition, the bottom bearing is arranged at the bottom with respect to the axis of the stator, and in contrast the drive nozzle system is arranged at the top (regardless of an actual orientation in space, for example with regard to gravitation).

Provided herein is an embodiment of the NMR-MAS stator according to the invention in which the first ventilation slot is formed with a first rear ventilation space which widens downwards, in particular widens conically, away from the drive nozzle system. The widening first rear ventilation space improves the discharge of the compressed drive gas.

Also advantageous is an embodiment in which a second ventilation slot is provided above the drive nozzle system in order to dissipate at least part of the compressed drive gas, wherein the second ventilation slot is formed with a second rear ventilation space which widens upwards, in particular widens conically, away from the drive nozzle system. The widening second rear ventilation space further improves the discharge of the compressed drive gas. In particular, intersecting compressed gas flows can be avoided in the region of the drive nozzle system.

Also provided herein is an embodiment in which the number of drive nozzles of the drive nozzle system is four to nine, preferably six to eight. This number has been proven in practice. A combination of eight drive nozzles with five turbine blades has been shown to be particularly efficient and surprisingly has enabled the greatest rotation frequencies in trials.

Further provided herein is an embodiment in which a diameter of the drive nozzles of the drive nozzle system is from 0.1 mm to 0.15 mm. These nozzle diameters are particularly efficient. Smaller nozzles have resulted in reduced rotation frequencies, possibly due to too low a compressed gas flow. Larger nozzle diameters can give rise to an accumulation of exhaust gas.

Finally, within the framework of the present invention falls an NMR-MAS system comprising an NMR-MAS rotor according to the invention and described above, and an NMR-MAS stator according to the invention and described above, in particular wherein an inside diameter RLID of the radial bearings is between 0.02 mm and 0.10 mm, preferably between 0.03 mm and 0.05 mm, greater than the outside diameter RRAD of the rotor tube. Such an NMR-MAS system enables NMR-MAS experiments on typically powdery solid samples to be carried out at rotation frequencies of 100 kHz and more, in particular 111 kHz and more. The NMR-MAS rotor and the NMR-MAS stator are adjusted to one another, in particular in the dimensions.

Further advantages of the invention can be seen from the description and the drawing. Likewise, according to the invention, the characteristics stated above and the characteristics explained further can in each case be applied individually in their own right or jointly in any combination. The embodiments shown and described are not to be understood as a conclusive list, but rather they have an exemplary character for illustrating the invention.

BRIEF DESCRIPTION OF THE DRAWINGS

The invention is shown in the drawing and is explained in more detail with reference to exemplary embodiments. In the drawing.

DETAILED DESCRIPTION

The present invention introduces a turbine cap for an NMR-MAS rotor, an associated NMR-MAS rotor having such a turbine cap and an NMR-MAS stator for the NMR-MAS rotor. Here, turbine, MAS rotor, and MAS stator are designed and adjusted to one another for an outside diameter of the rotor tube between 0.675 mm and 0.725 mm, in particular of 0.700 mm±0.005 mm. The invention enables for the first time to rotate a solid sample at frequencies of up to 111 kHz and, as a result, to correspondingly reduce line broadening due to anisotropic effects in NMR measurements as part of a rotation below the so-called "magic angle" (magic angle spinning, MAS).

Turbine Cap

Figure 1:
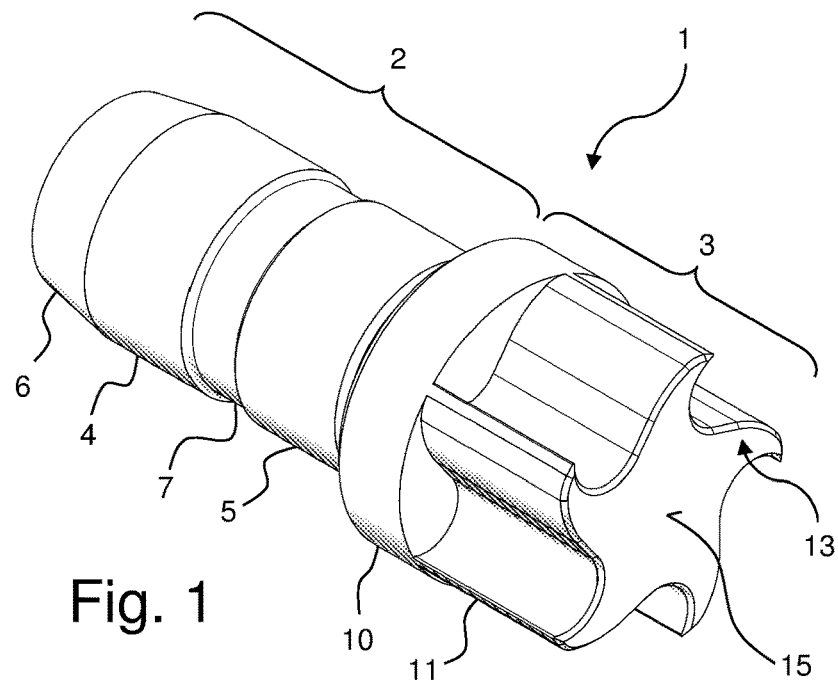
FIG. 1 shows a schematic oblique view of an embodiment of a turbine cap according to the invention.
Figure 2:
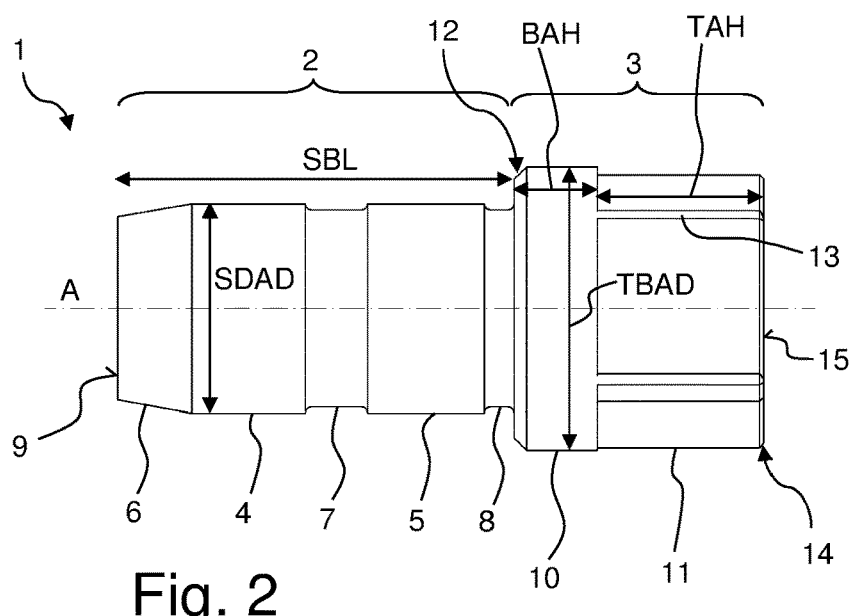
FIG. 2 shows a schematic side view of the turbine cap of FIG. 1.

FIG. 1 shows an exemplary embodiment of a turbine cap 1 according to the invention in a schematic oblique view; FIG. 2 shows this turbine cap 1 in a schematic side view. The turbine cap 1 is made from polyamide and has a stopper region 2 and a turbine region 3. The stopper region 2 has a first sealing section 4 and a second sealing section 5, which are designed for resting against the inside of the rotor tube (cf. FIG. 5) with a press fit. Here, the outside diameter SDAD of the two sealing sections 4, 5 is 0.503 mm±0.003 mm. A conical projection 6, which simplifies feeding into the rotor tube, is located at the front end of the stopper region 2. A groove 7, which improves the sealing effect of the sealing sections 4, 5, is provided between the sealing sections 4, 5. A recess 8, which improves the contact of the turbine region 3 with the rotor tube, is formed at the end of the stopper region 2 near to the turbine ("top" end). The stopper region 2 is made of solid material, in particular without an axial hole on the "bottom" face side 9 of the turbine cap 1. Here, the axial length SBL of the stopper region 2 is 0.95 mm±0.01 mm; in other embodiments, SBL can also be chosen between 0.75 mm and 1.20 mm, preferably with a tolerance of ±0.02 mm.

The turbine region 3 is formed with a collar section 10 and a turbine section 11. The collar section 10 is substantially disc-shaped and here has an axial height BAH of 0.20 mm±0.02 mm and an outside diameter TBAD of 0.680 mm±0.005 mm. The collar section 10 is provided with a chamfer 12 on its side facing the stopper region 2.

Five turbine blades 13, which project from the top side of the collar section 10 in the axial direction (cf. rotor axis A in FIG. 2), are formed on the collar section 10; the side walls of the turbine blades 13 are aligned parallel to the rotor axis A. The turbine blades 13 extend in the radial direction to the edge of the collar section 10 but not beyond it. The turbine blades 13 are provided with a chamfer 14 at their "upper" face side 15. Here, the turbine section 11 has an axial height TAH of 0.40 mm±0.02 mm.

Figure 3:
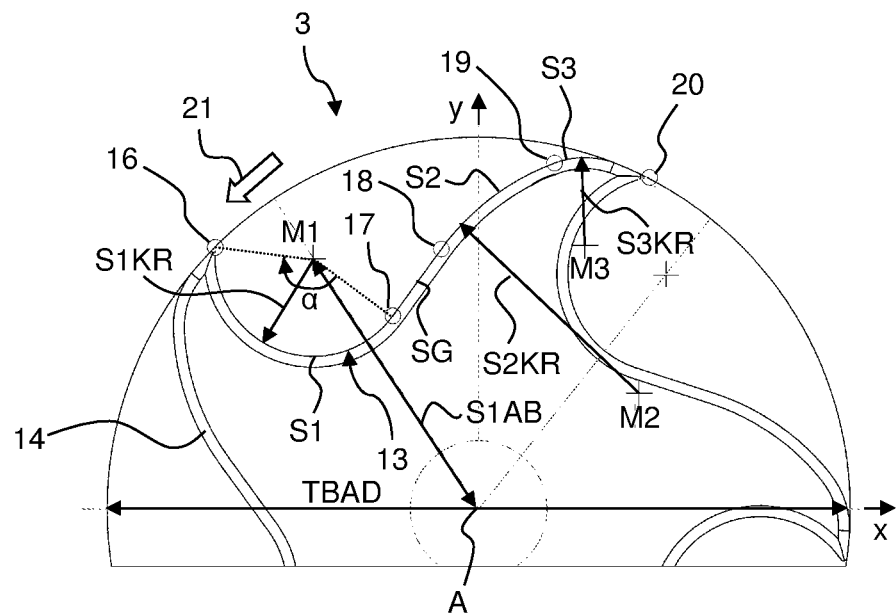
FIG. 3 shows a schematic top view on the turbine section of the turbine cap of FIG. 1.

The geometry of the turbine blades 13 can be seen from the axial view along the rotor axis A in FIG. 3. As a result of the chamfer 14, which here has a width of 0.01 mm in plan view, the turbine blades 13 appear as a double line in the plan view; the side surfaces of the turbine blades 13 are in each case determined by the radially outer line. All five turbine blades 13 are formed identically (within the manufacturing tolerance). The transitions of the different blade pieces of a turbine blade 13 are marked with small circles in FIG. 3.

Starting at a blade tip 16, a concave first blade piece S1 with a first circular contour is formed. Here, the radius of curvature S1KR of this first circular contour is 0.09 mm (measured to the side wall, also applicable in the following). The central axis M1 of the first circular contour lies at a distance S1AB of 0.275 mm from the axis A. Here, the first blade piece S1 has a central angle α of approx. 150°. The contour length S1KL (not shown) of the first blade piece S1 is accordingly approx. 0.235 mm.

A straight blade piece SG is connected to the first blade piece S1 at the transition 17. Here, this has a contour length SGKL (not shown) of approximately 0.076 mm.

A convex, second blade piece S2 with a second circular contour with central axis M2 starts at the transition 18. Here, the radius of curvature S2KR is 0.224 mm, and the contour length S2KL (not shown) approximately 0.132 mm.

At the transition 19, the second blade piece S2 merges into a third blade piece S3 which has a third circular contour with a central axis M3. Here, the radius of curvature S3KR of the third circular contour is 0.08 mm, and the contour length S3KL (not shown) approximately 0.085 mm. The third blade piece S3 ends at a next blade tip 20.

Here, the contour length TSKL (not shown) of a complete turbine blade 13, which appears approximately J-shaped in plan view, is approximately 0.53 mm.

In the coordinate system x, y shown in FIG. 3, the following transitions/structures are positioned as follows (transitions for other turbine blades are positioned accordingly rotated by 72° or multiples thereof):

| Transition/Structure | Position x (mm) | Position y (mm) |
| --- | --- | --- |
| 16 | −0.2407 | 0.2401 |
| 17 | −0.0785 | 0.1767 |
| 18 | −0.0341 | 0.2378 |
| 19 | 0.0695 | 0.3163 |
| 20 | 0.1238 | 0.3166 |
| M1 | −0.1513 | 0.2296 |
| M2 | 0.1471 | 0.1061 |
| M3 | 0.0972 | 0.2412 |
| A | 0 | 0 |

A compressed gas flow 21 that is blown in approximately tangentially at the turbine blade 13 is guided along the first blade piece S1, wherein a torque is exerted on the turbine cap which seeks to rotate the turbine cap about the rotor axis A in an anticlockwise direction. The compressed gas flow is guided further on the straight blade piece SG, the second blade piece S2 and the third blade piece S3 and fed out once more. In doing so, the sharp blade tips 16, 20 contribute towards preventing mutual interference (turbulence) of inflowing and outflowing compressed gas flow.

Figure 4:
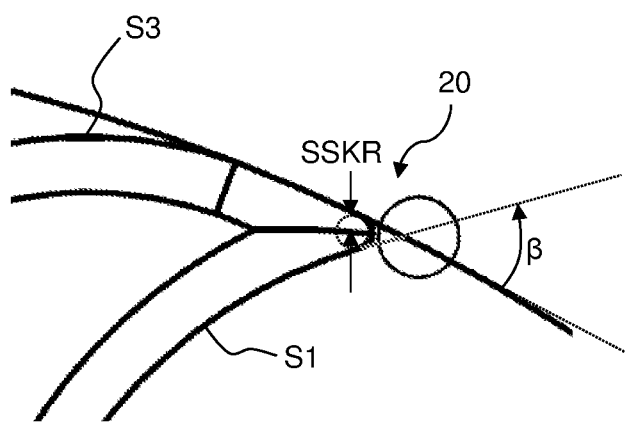
FIG. 4 shows a detailed section of FIG. 3 in the region of a blade tip.

FIG. 4 shows an enlarged section from FIG. 3 in the region of the blade tip 20. Here, the radius of curvature SSKR at the blade tip 20 is approximately 0.003 mm±0.001 mm. Here, the edge region of the first blade piece S1 and third blade piece S3 enclose an angle β of approximately 48°; in other embodiments, the angle β can be between 40° and 55°, preferably with a tolerance of ±0.2° or better.

NMR-MAS Rotor

Figure 5:
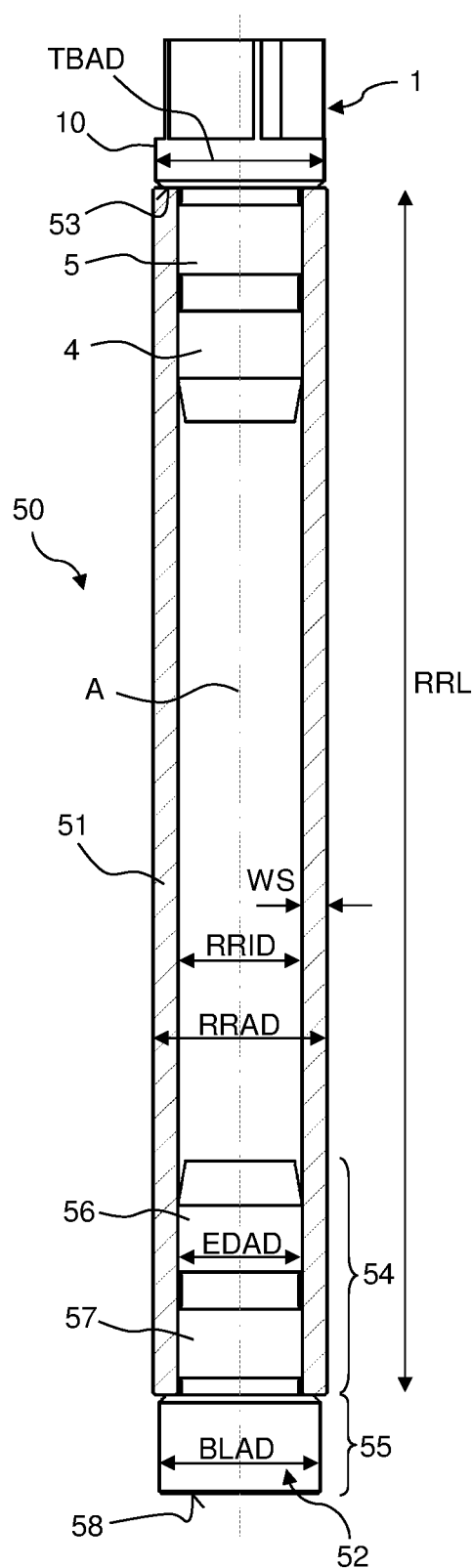
FIG. 5 shows a schematic, partially sectioned side view of an embodiment of an NMR-MAS rotor according to the invention with a turbine cap according to FIG. 1.

FIG. 5 shows an embodiment of an NMR-MAS rotor 50 according to the invention, here comprising a rotor tube 51 which is open on both sides, a turbine cap 1 (as shown in FIG. 1-4), and a bottom cap 52. A solid sample (usually in powder form) (not shown) can be enclosed inside the rotor tube 51, sealed by the turbine cap 1 and the bottom cap 52, for recording an NMR spectrum with rotation about the "magic angle" (54.74° to the static magnetic field, not shown). It should be noted that, in general, the direction along the rotor axis A towards the turbine cap 1 or the turbine blades is described as "top," and the direction towards the bottom cap as "bottom," regardless of the actual orientation in space (for example, with regard to gravitation).

Here, the rotor tube 51 is made of ZrO2 and has an outside diameter RRAD of 0.700 mm, with a concentricity tolerance of 0.004 mm. The inside diameter RRID is 0.500 mm, thus resulting in a wall thickness WS here of 0.100 mm. Here, the length RRL of the rotor tube 51 along the axis A is 4.9 mm; in another, preferred embodiment, the length RRL is 4.6 mm.

When the turbine cap 1 is fitted, the sealing sections 4, 5 of the turbine cap 1 are slightly compressed elastically commensurate with their excess size of 0.003 mm. The underside of the collar section 10 rests against the top face side 53 of the rotor tube 51. Commensurate with the outside diameter TBAD of the collar section 10 of 0.68 mm, the collar section 10, and thus the entire turbine cap 1, is radially slightly recessed with respect to the rotor tube 51.

The bottom cap 52, here made from polyamide, has an insertion region 54 and a bearing region 55. The insertion region 54 is formed with two sealing sections 56, 57, which, in the relaxed state, have an outside diameter EDAD of 0.503 mm (corresponding to the sealing sections 4, 5 of the turbine cap) and, in the inserted state, are slightly compressed elastically commensurate with their excess size of 0.003 mm. Here, the outside diameter BLAD of the bearing region 55 is 0.68 mm (corresponding to the collar section 10). The bearing region 55 forms a flat face surface 58 on the underside which has an axial runout of 0.005 mm or better.

NMR-MAS Stator and NMR-NAS System

Figure 6:
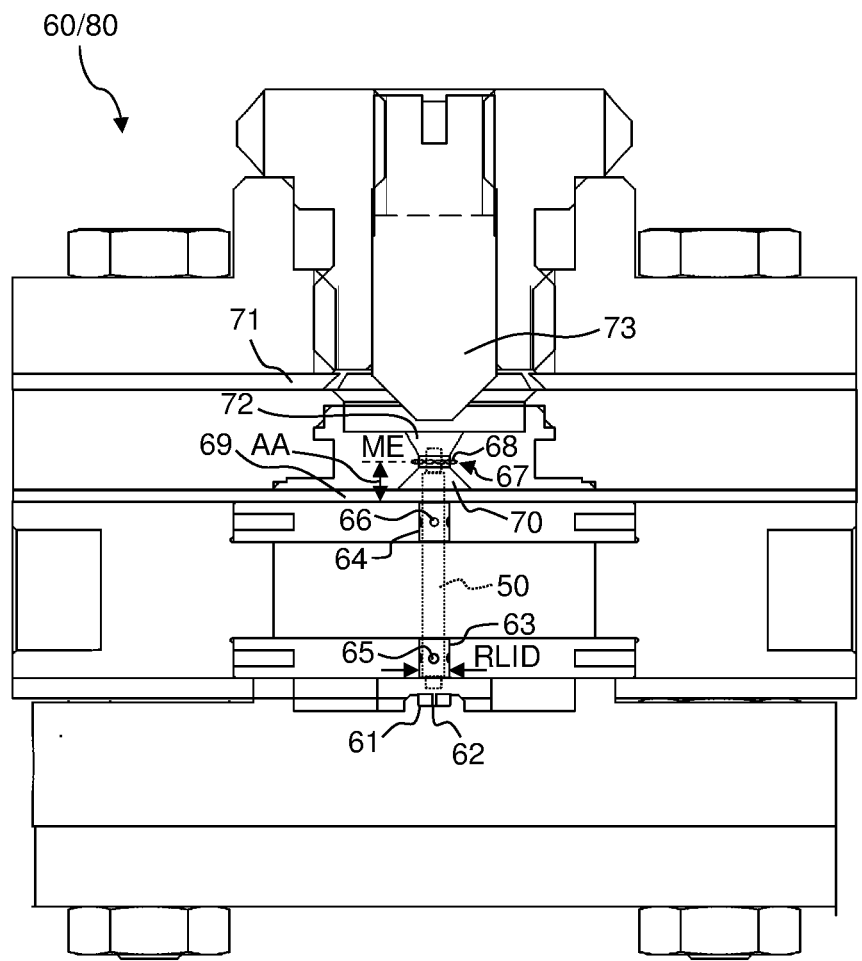
FIG. 6 shows a schematic cross-sectional view of a probe with an embodiment of an NMR-MAS stator according to the invention, in particular for the NMR-MAS rotor of FIG. 5.

In a schematic cross-sectional view, FIG. 6 shows an NMR-MAS stator 60 according to the invention for the NMR-MAS rotor of FIG. 5.

The NMR-MAS stator 60 comprises a bottom bearing 61 with a bearing nozzle 62, two radial bearings 63, 64 with bearing nozzles 65, 66 and a drive nozzle system 67 with, here, eight drive nozzles 68. The drive nozzles 68 blow compressed drive gas (preferably air) approximately tangentially to the NMR-MAS rotor 50 at the level of the turbine blades.

The NMR-MAS rotor 50 (shown dotted), which is fed into the NMR-MAS stator 60, is held in position in a noncontact manner in the radial bearings 63, 64 and above the bottom bearing 61 by means of the bearing nozzles 61, 65, 66. At the same time, the turbine section of the turbine cap is located axially at the level of the drive nozzle system 67. The radial bearings 63, 64 have an inside diameter RLID here of 0.740 mm, which is to say approximately 40 μm greater than the outside diameter of the rotor tube.

The NMR-MAS stator 60 has a drive distance AA from the bottom edge of a first ventilation slots 69 to a central plane ME of the drive nozzles 68 of, in this case, 0.70 mm. Compressed drive gas from the drive nozzles 68 can exhaust to the outside via the first ventilation slot 69. In doing so, the gas flow is fed through a first rear pressure space 70, which widens conically downwards. As a rule, the first ventilation slot 69 comprises a plurality of star-shaped individual channels which are fed radially outwards (not shown in detail).

Furthermore, here, the NMR-MAS stator 60 also has a second ventilation slot 71, by means of which a further part of the compressed drive gas from the drive nozzles 68 can exhaust outwards. In doing so, the gas flow is fed via a second rear pressure space 72, which widens conically upwards, and further intermediate spaces above it. As a rule, the second ventilation slot 71 also comprises a plurality of star-shaped individual channels which are fed radially outwards (not shown in detail).

Here, a feed device 73, by means of which the NMR-MAS rotor 50 can be fed into and removed from the NMR-MAS stator 60, is provided above the drive nozzle system 67. In particular, the feed device 73 can comprise a suction hose (not shown in detail).

The totality of NMR-MAS stator 60 and associated NMR-MAS rotor 50 forms an NMR-MAS system 80.

Figure 7:
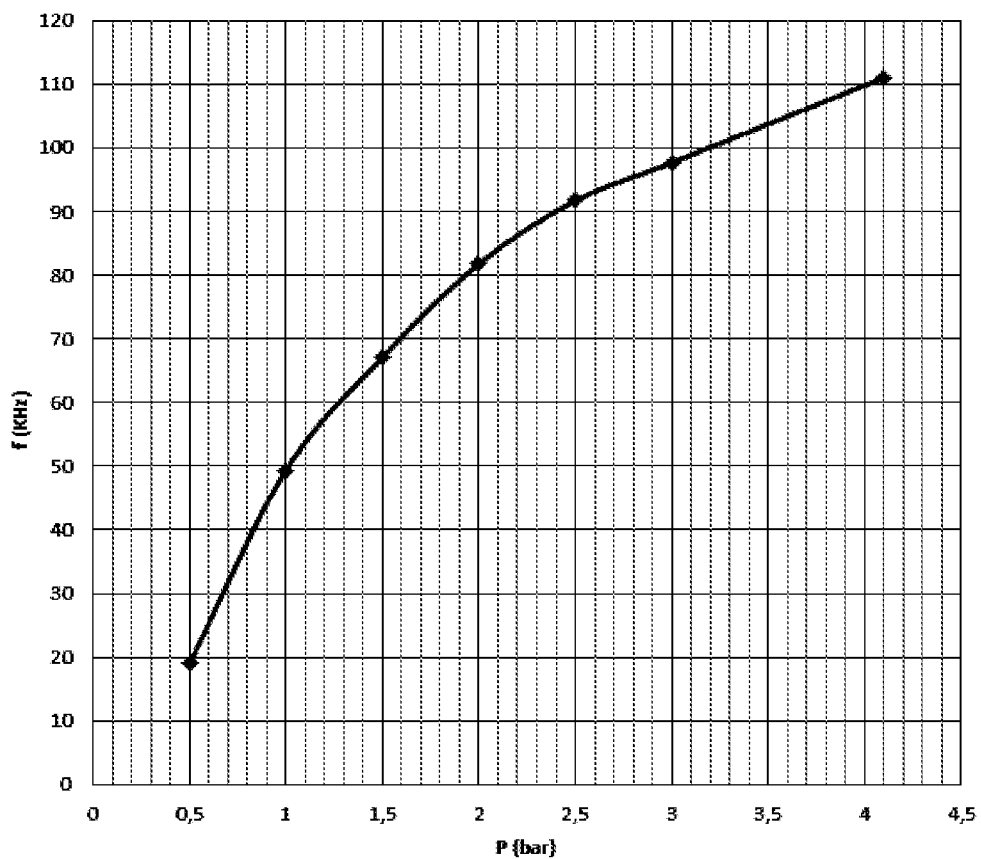
FIG. 7 shows a diagram of rotation frequencies achieved with the NMR-MAS rotor according to FIG. 5 in an NMR-MAS stator according to FIG. 6 as a function of the pressure of the compressed drive gas.

FIG. 7 shows, in a diagram, experimental measurements of the rotation frequency f (plotted upwards) of an NMR-MAS rotor according to FIG. 5 which had been arranged in an NMR-MAS stator according to FIG. 6 and with compressed drive gas at different pressures p. Higher rotation frequencies f were achieved with increasing pressure p. A rotation frequency of 111 kHz was achieved at a pressure of 4.1 bar.

The invention claimed is:

1. A turbine cap for an NMR-MAS rotor comprising:
a stopper region for feeding into a rotor tube of the NMR-MAS rotor, the stopper region having at least one sealing section for resting against an inner wall of the rotor tube, wherein the sealing section has an outside diameter SDAD between 0.303 mm and 0.603 mm; and
a turbine region, which projects radially with respect to the stopper region and which is formed with five turbine blades, the turbine region having a collar section for resting against a face side of the rotor tube, said collar section having an outside diameter TBAD, with TBAD>SDAD, and wherein the turbine region further has a turbine section which forms the turbine blades, which protrude axially from the collar section, and which do not extend radially beyond the collar section, the turbine blades being formed with a blade tip having a radius of curvature SSKR between 0.0020 mm and 0.0045 mm, and a concave first blade piece (S1) connecting to the blade tip having a first circular contour with a radius of curvature S1KR between 0.050 mm and 0.150 mm.

2. The turbine cap according to claim 1, wherein the collar section of the turbine region has an outside diameter TBAD between 0.650 mm and 0.695 mm.

3. The turbine cap according to claim 1 wherein the first circular contour extends over a central angle (α) between 135° and 160°.

4. The turbine cap according to claim 1 wherein a total contour length TSKL of a particular turbine blade is between 0.40 mm and 0.75 mm.

5. The turbine cap according to claim 1 wherein the turbine blades further comprise a straight blade piece (SG), which is connected to the first blade piece (S1), a convex, second blade piece (S2), which is connected to the straight blade piece (SG) and has a second circular contour with a radius of curvature S2KR between 0.180 mm and 0.260 mm, and a convex, third blade piece (S3), which is connected to the second blade piece (S2) and leads to the blade tip (16, 20), having a third circular contour with a radius of curvature S3KR between 0.065 mm and 0.095 mm.

6. The turbine cap according to claim 5, wherein the following applies for the radius of curvature S1KR of the first blade piece (S1) and the radius of curvature S3KR of the third blade piece (S3): 0.6*S1KR≤S3KR≤1.0*S1KR.

7. The turbine cap according claim 5 wherein a contour length GSKL of the straight blade piece (SG) is between 0.055 mm and 0.095 mm, a contour length S2KL of the second blade piece (S2) is between 0.110 mm and 0.160 mm, and a contour length S3KL of the third blade piece (S3) is between 0.060 mm and 0.110 mm.

8. The turbine cap according to claim 1 wherein a central axis (M1) of the first circular contour of the first, concave blade piece (S1) is arranged at a distance S1AB from a rotor axis (A) of the turbine cap (1) between 0.24 mm and 0.32 mm.

9. The turbine cap according to claim 1, wherein a central axis (M1) of the first circular contour of the first, concave blade piece (S1) is arranged at a distance S1AB from a rotor axis (A) of the turbine cap, wherein the following applies: 0.70*TBAD/2≤S1AB≤0.95*TBAD/2.

10. The turbine cap according to claim 1 wherein the collar section has an axial height BAH between 0.15 mm and 0.30 mm, and the turbine section has an axial height TAH between 0.32 mm and 0.55 mm.

11. An NMR-MAS rotor comprising:
a turbine cap according to claim 1; and
a rotor tube having an outside diameter RRAD between 0.675 mm and 0.725 mm, and an inside diameter RRID, wherein the outside diameter SDAD of the at least one sealing section of the stopper region of the turbine cap is greater than RRID by an excess UEM, wherein UEM is between 0.015 mm and 0.045 mm, and the rotor tube has a length RRL between 4.15 mm and 5.15 mm.

12. The NMR-MAS rotor according to claim 11, wherein the following applies: 0.64≤RRID/RRAD≤0.80.

13. The NMR-MAS rotor according to claim 11, wherein the rotor tube is open on both sides, and the NMR-MAS rotor has a bottom cap with an insertion region for feeding into the rotor tube and a bearing region for forming a Bernoulli bearing, the insertion region having at least one sealing section for resting against the inner wall of the rotor tube, wherein the outside diameter EDAD of the sealing section is greater than the inside diameter RRID of the rotor tube by the excess UEM.

14. The NMR-MAS rotor according to claim 13, wherein the bearing region forms a flat face surface with an axial runout of 0.005 mm or better.

15. The NMR-MAS rotor according to claim 11 wherein TBAD<RRAD.

16. An NMR-MAS stator for accommodating an NMR-MAS rotor according to claim 11, the stator comprising a bottom bearing with at least one bearing nozzle, at least two radial bearings each comprising a plurality of bearing nozzles, and at least one drive nozzle system comprising a plurality of drive nozzles, wherein a first ventilation slot is provided between the topmost radial bearing and the drive nozzle system in order to dissipate at least part of a compressed drive gas, and wherein a drive distance (AA) that is the axial distance between the bottom edge of the first ventilation slot and the central plane (ME) of the drive nozzles of the drive nozzle system is between 0.5 mm and 1.0 mm.

17. The NMR-MAS stator according to claim 16, wherein the first ventilation slot is formed with a first rear ventilation space which widens downwards away from the drive nozzle system.

18. The NMR-MAS stator according to claim 17, wherein a second ventilation slot is provided above the drive nozzle system in order to dissipate at least part of the compressed drive gas, and wherein the second ventilation slot is formed with a second rear ventilation space which widens upwards away from the drive nozzle system.

19. The NMR-MAS stator according to claim 16 wherein a number of drive nozzles of the drive nozzle system is between four and nine.

20. The NMR-MAS stator according to claim 16 wherein a diameter of the drive nozzles of the drive nozzle system is between 0.1 mm and 0.15 mm.

21. An NMR-MAS system comprising an NMR-MAS rotor and an NMR-MAS stator according to claim 16, wherein an inside diameter RLID of the radial bearings is between 0.02 mm and 0.10 mm greater than an outside diameter RRAD of the rotor tube.

* * * * *